United States Patent
Sankaran et al.

(10) Patent No.: US 7,541,952 B1
(45) Date of Patent: Jun. 2, 2009

(54) METHOD AND APPARATUS FOR OFFSET AND GAIN COMPENSATION FOR ANALOG-TO-DIGITAL CONVERTERS

(75) Inventors: Sundar Sankaran, Santa Clara, CA (US); Tuofu Lu, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 0 days.

(21) Appl. No.: 11/870,352

(22) Filed: Oct. 10, 2007

(51) Int. Cl.
*H03M 1/06* (2006.01)

(52) U.S. Cl. .................. 341/118; 341/117; 341/119; 341/120; 341/155

(58) Field of Classification Search ............ 341/155, 341/117–120; 375/322, 319, 260, 337, 344–346, 375/349; 455/232.1
See application file for complete search history.

(56) References Cited

U.S. PATENT DOCUMENTS

| | | | | |
|---|---|---|---|---|
| 6,509,852 B1 * | 1/2003 | Todsen et al. | ............... | 341/120 |
| 6,928,092 B2 * | 8/2005 | Broutin et al. | ................ | 372/20 |
| 7,068,987 B2 * | 6/2006 | Baldwin et al. | ........... | 455/232.1 |
| 7,233,631 B2 * | 6/2007 | Van Bezooijen et al. | ..... | 375/319 |
| 2002/0075892 A1 * | 6/2002 | Bezooijen et al. | ........... | 370/442 |
| 2004/0032854 A1 * | 2/2004 | Huang et al. | ................ | 370/350 |
| 2005/0157819 A1 * | 7/2005 | Wang et al. | ................. | 375/322 |
| 2006/0050800 A1 * | 3/2006 | Aytur et al. | ................. | 375/260 |

* cited by examiner

*Primary Examiner*—Jean B Jeanglaude
(74) *Attorney, Agent, or Firm*—Bever, Hoffman & Harms, LLP; Jeanette S. Harms

(57) ABSTRACT

A method for determining a gain compensation value for multiple ADCs sums an absolute value of a number of ADC output samples from each of the ADCs that may be collected while the ADCs are in normal operation. In one embodiment, the ratio of the sums of the absolute values of ADC output samples may reflect the difference in gains between the ADCs, and may be used to determine the ADC gain compensation value. A method for determining an offset compensation value between for multiple ADCs averages of a number of ADC output samples from each ADC collected while the ADCs are in normal operation. In one embodiment, a difference between the ADC sample averages may reflect the difference in magnitudes of the ADC offsets for each ADC, and may be used to determine the ADC offset compensation value.

18 Claims, 6 Drawing Sheets

METHOD AND APPARATUS FOR OFFSET AND GAIN COMPENSATION FOR ANALOG-TO-DIGITAL CONVERTERS

BACKGROUND OF THE INVENTION

1. Field of the Invention

Embodiments of the specification generally relate to analog-to-digital converters (ADCs) and more particularly for determining the offset and gain compensation values for two or more ADCs.

2. Description of the Related Art

Analog-to-digital converters (ADCS) are often used to sample analog signals so that such signals may be digitally represented. Successive approximation register (SAR) ADCs are widely used because of their relatively small size and relatively low power consumption when compared to traditional ADCs. One of the limitations of SAR ADCs is a relatively low sampling rate. This limitation may be addressed by using a well-known time-interleaved architecture, which may achieve relatively higher sampling rates by time multiplexing an array of two or more SAR ADCs operating at a lower sampling rate. For example, an effective sampling rate of 80 MHz may be achieved by time multiplexing two SAR ADCs, each of which may be operating at a 40 MHz sampling rate.

One drawback of this time multiplexing approach arises due to the mismatches among the SAR ADCs. Almost every ADC has associated offset and gain errors, and these errors may not be the same in all the ADCs used in the time-interleaved architecture. Differing offset errors between ADCs may introduce distortion in the form of noise spurs into the digitized signal, while a difference in gain errors may cause aliasing distortion. These distortions may be minimized by calibrating the ADCs to compensate for the mismatches. Periodic calibration may be preferred, since the offset and gain errors may vary with temperature.

There are several well-known methods for calibrating two or more ADCs. One method isolates ADC inputs from the ADC's normal input source and provides a known signal to the ADCs. Offset and gain compensation values may be determined by examining the ADC outputs as the ADCs respond to the known signal input. One drawback to this calibration method is that periodic calibration of the ADCs may be difficult since isolating the ADC inputs temporarily removes the ADC from service interrupting normal data processing and may reduce data throughput.

Wireless communication systems may transfer data between a transmitter and one or more receivers. The operation of wireless communication systems may be governed, for example, by standards, such as the IEEE 802.11 family of standards. Receivers in a wireless communication system typically use one or more ADCs to convert a received RF signal to a digital signal that may be processed further to recover the transmitted data. Using two or more SAR ADCs in this application may be advantageous, because of their relatively smaller size and relatively lower power consumption. One disadvantage of the SAR ADCs in this application stems from the periodic calibration that should be performed to compensate for gain and offset mismatches. Interrupting regular data processing for the periodic calibration may decrease overall data throughput of the wireless communication system.

Therefore, what is needed in the art is a method for calibrating ADCs without interrupting regular data processing.

SUMMARY OF THE INVENTION

A method for compensating the gain of multiple ADCs in a wireless receiver may determine a gain compensation value by collecting output samples from the multiple ADCs. A reference ADC may be specified from the multiple ADCs and the gain compensation value may be applied to ADC output samples from non-reference ADCS. In one embodiment, the ADC output samples used to determine the gain compensation value may be payload data samples instead of non-payload data samples such as wireless preamble data. In one embodiment, the gain compensation value may be determined by a ratio of ADC output samples from the reference ADC to the non-reference ADC. Typically, many ADC output samples may be collected to provide a more accurate gain compensation value. In one embodiment, $2^{15}$ ADC output samples are collected. In another embodiment, the number of ADC output samples may be determined by software. In one embodiment, the ratio of ADC output samples may be determined by a ratio of sums of absolute values of collected ADC output samples.

In one embodiment, the method for compensating the gain of multiple ADCs may include a method for compensating the offset of the multiple ADCs. In one embodiment, gain-compensated ADC output samples from the non-reference ADC may be collected. In one embodiment, an offset compensation value may be determined by the difference between averages of ADC output samples from the reference ADC, and gain-compensated ADC output samples from the non-reference ADC. In another embodiment, the number of collected ADC output samples may be determined by software.

A method for compensating the offset of multiple ADCs within a wireless receiver may determine an offset compensation value by collecting ADC output samples from the multiple ADCs. A reference ADC may be specified from the multiple ADCs and the offset compensation value may be applied to the ADC output samples from the non-reference ADCs. In one embodiment, the ADC output samples used to determine the offset compensation value may be payload data samples. In one embodiment, the offset compensation value may be determined by the difference between averages of ADC output samples from the reference ADC and ADC output samples from the non-reference ADC. In another embodiment, the number of collected ADC output samples may be determined by software.

In one embodiment, the method for compensating the offset of multiple ADCs may also compensate the gain of the multiple ADCs. In one embodiment, offset-compensated ADC output samples from the non-reference ADC may be collected. In one embodiment, the gain compensation value may be determined by a ratio of ADC output samples from the reference ADC to offset-compensated ADC output samples from the non-reference ADC. Typically, many ADC output samples may be collected to provide a more accurate gain compensation value. In one embodiment, $2^{15}$ ADC output samples are collected. In another embodiment, the number of ADC output samples may be determined by software. In one embodiment, the ratio of ADC output samples may be determined by a ratio of sums of absolute values of collected ADC output samples.

One embodiment of an apparatus for compensating the gain and offset of multiple ADCs includes a reference ADC, at least one non-reference ADC, a gain calculator and a gain adjuster. The gain calculator may determine a gain compensation value from ADC output samples from the reference and non-reference ADCs. The gain compensation value may be applied to output samples from the non-reference ADC thorough the gain adjuster. In one embodiment, the gain calculator may determine a gain compensation value from ADC output samples that are payload data samples. The apparatus may also include an offset calculator and an offset adjuster. The offset calculator may determine an offset compensation value from gain-compensated ADC output samples from the non-reference ADC and ADC output samples from the reference ADC. In one embodiment, the offset compensation value may be applied to the gain-compensated ADC output samples from the non-reference ADC processed by the gain adjuster.

Another embodiment of an apparatus for compensating the gain and offset of multiple ADCs may determine an offset compensation value prior to determining a gain compensation value.

DETAILED DESCRIPTION

Embodiments of the specification determine ADC gain and offset compensation values for two or more ADCs by analyzing ADC output data collected while the ADCs are processing data. The ADCs may be compensated by applying the compensation values to the outputs of one or more of the ADCs.

Figure 1:
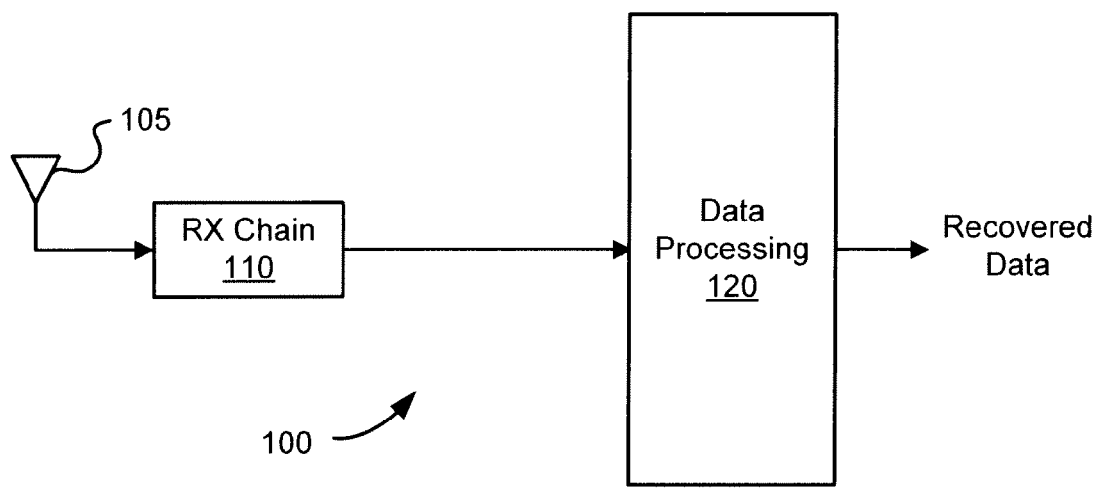
FIG. 1 is a block diagram of a prior art wireless receiver for a wireless communication system.

FIG. 1 is a block diagram of a prior art wireless receiver 100 for a wireless communication system. The operation of wireless communication systems may be governed by one or more standards, such as the IEEE 802.11 family of standards. The wireless receiver 100 may be configured to receive RF signals transmitted by a wireless transmitter. The wireless receiver 100 includes, without limitation, an antenna 105, a receive (RX) chain 110, and a data processing unit 120. In alternative embodiments, the wireless receiver 100 may include more than one RX chain, such as a multiple-input multiple-output (MIMO) wireless receiver. The antenna 105 is coupled to the RX chain 110. The antenna receives and provides RF signals to the RX chain 110. The RX chain 110 processes the RF signals and produces a digital baseband signal. The RX chain 110 is coupled to the data processing unit 120. The RX chain 110 provides the digital baseband signal to the data processing unit 120. The data processing unit 120 processes the digital baseband signal and recovers transmitted data. The recovered transmitted data may be provided by the data processing unit 120 to other units (not shown) such as a central processing unit (CPU) or memory.

Figure 2:
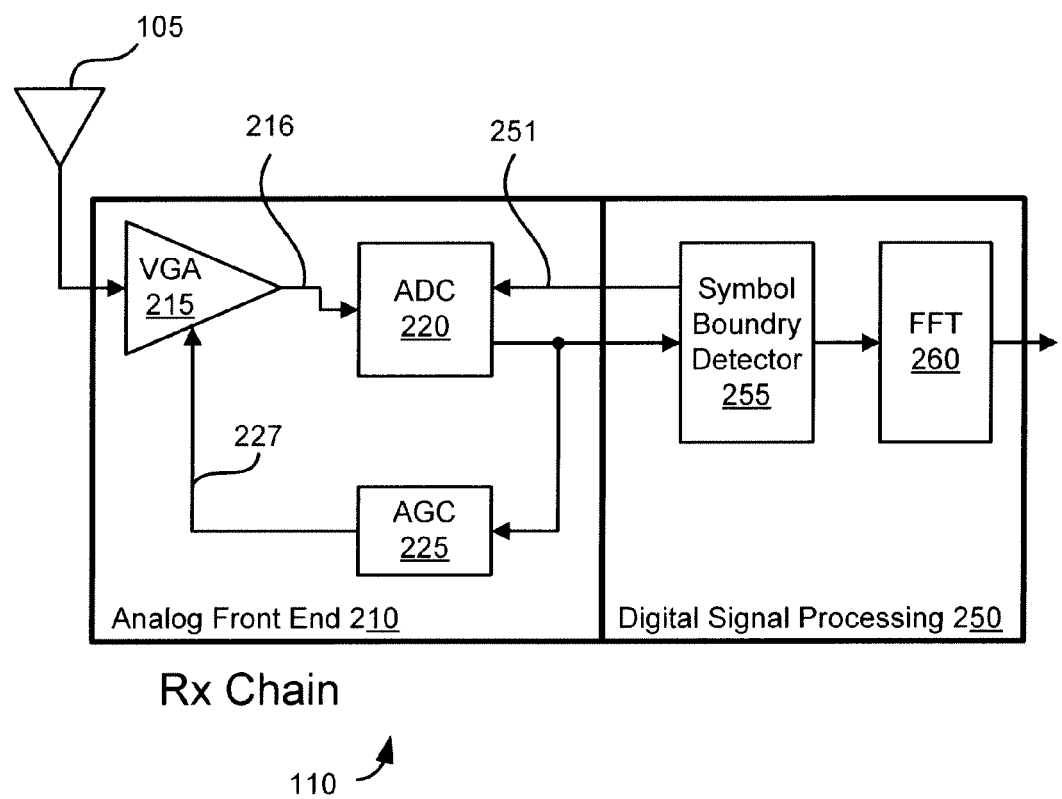
FIG. 2 is a detailed block diagram of the RX chain of FIG. 1.

FIG. 2 is a detailed block diagram of the RX chain 110 of FIG. 1. The RX chain 110 includes, without limitation, an analog front end 210 and a digital signal processing unit 250. The analog front end 210 includes a variable gain amplifier (VGA) 215, an analog-to-digital converter (ADC) block 220, and an automatic gain controller (AGC) 225. The digital signal processing unit 250 includes a symbol boundary detector 255 and a Fast Fourier Transform unit 260.

The antenna 105 is coupled to the VGA 215. The antenna 105 receives and provides RF signals to the VGA 215. In one embodiment, the VGA 215 may be configured to adjust the relative strength of the provided RF signal proportional to an amount of gain determined by an external gain control signal. In some embodiments, the VGA 215 may also include additional devices, such as one or more mixers, filters and oscillators (not shown here), to convert RF signals to analog baseband signals. The output of the VGA 215 provides an analog baseband signal 216 to the ADC block 220. The ADC block 220 converts the analog baseband signal 216 to a digital baseband signal. The output of the ADC block 220 is coupled to the AGC 225 and to the symbol boundary detector 255.

The AGC 225 may determine the gain of the VGA 215 by examining, among other things, the output of the ADC block 220. For example, the AGC 225 may set the gain of the VGA 215 so that the output of the ADC block 220 is not limited by the upper or lower bounds of the ADC block 220. In one embodiment, the AGC 225 may set the gain of the VGA 215 through an external gain control signal 227 that may be coupled to the VGA 215.

Wireless communication systems may transmit payload data and preamble data as set forth in the IEEE 802.11 family of standards. Preamble data is often used by a wireless receiver to capture transmitted signals by, for example, evaluating gain adjustments of amplifiers used to receive wireless communication signals. The symbol boundary detector 255 examines the output of the ADC block 220 and may determine when symbol boundaries occur between preamble data and payload data as well as determine when boundaries may occur between individual payload data symbols. The symbol boundary detector 255 may also produce a "valid" signal 251 that indicates when the ADC block 220 is producing payload data and not, for example, preamble data. In one embodiment the valid signal may be a Boolean signal. The symbol boundary detector is coupled to the ADC block 220 and the FFT unit 260. In one embodiment, the ADC block 220 may process the payload data and produce a digital baseband signal that may be coupled from the ADC block 220 to the FFT unit 260. The FFT unit 260 may process the digital baseband signal and recover the transmitted data. The symbol boundary detector may provide the valid signal 251 to the ADC block 220. The valid signal 215 may be used by the ADC block 220 to calibrate two or more ADCs, which is described in greater detail below in FIG. 3.

The ADC block 220 may be implemented as an ADC array that includes two or more ADCs, such as successive approximation register (SAR) ADCs, configured, for example, in a time-interleaved architecture. As described herein, the gain and offset characteristics of the two or more ADCs should be matched to reduce distortion that may be introduced by the ADCS. ADC offset and gain matching is described in greater detail in conjunction with FIG. 3.

FIG. 3 is a detailed block diagram of an exemplary ADC block 220 (FIG. 2). In this embodiment, the ADC block 220 includes, without limitation, a first ADC 310A and a second ADC 310B. The ADC block 220 also includes a first and a second ADC absolute value accumulator (315A and 315B respectively), a gain calculator 320, a gain adjustment unit 325, a first and a second ADC sample averager (330A and 330B respectively), an offset calculator 335, an offset adjustment unit 340, and an interleaver 370. In other embodiments, the ADC block 220 may include more than two ADCs, ADC absolute value accumulators, and ADC sample averagers.

As shown in FIG. 3, the ADCs 310A and 310B are arranged in a time-interleaved architecture such that the ADC outputs may be multiplexed, effectively doubling the sampling rate of an individual ADC. The inputs of the ADCs 310A and 310B are both coupled to the output of the VGA 215 (not shown). The VGA 215 provides the analog baseband signal 216 to the ADCs 310A and 310B. The output of the first ADC 310A is coupled to the first ADC absolute value accumulator 315A while the output of the second ADC 310B is coupled to the second ADC absolute value accumulator 315B and the second ADC sample averager 330B. The output of the gain adjustment unit 325 is coupled to the input of the first ADC sample averager 330A. In this configuration, ADC 310A is specified as the "reference" ADC (wherein an ADC block has only one reference ADC), whereas ADC 310B is specified as the "non-reference" ADC (which applies to any ADC other than the reference ADC).

Offset and gain compensation values that may be developed for the ADCs 310A and 310B may be developed with respect to the reference ADC and applied to each non-reference ADC. Specifically, output samples from the non-reference ADCs may receive further processing to apply developed offset and gain compensation values. As indicated above, in the exemplary ADC block 220, the second ADC 310B is specified as the reference ADC. Thus, offset and gain compensation values may be applied to the output of the non-reference ADC (i.e., the first ADC 310A. Accordingly, the output of the first ADC 310A is coupled to the gain adjustment unit 325 and the output of the second ADC 310B is coupled to the interleaver 370.

The first and second ADCs 310A and 310B alternately sample the analog baseband signal 216 producing a first and a second digital baseband signal (311A and 311B respectively). While the analog baseband signal 216 may include payload data, the signal 216 may also include preamble data that may include one or more training fields. As described herein, preamble data may be used by a wireless receiver to, among other things, adjust the gain of amplifiers, such as variable gain amplifiers (not shown), that may be used to receive RF signals. Returning to FIG. 3, gain changes may be applied to the VGA 215 (not shown) while receiving preamble data causing the outputs of the ADCs 310A and 310B change and may become unreliable. Thus, ADC output samples should not be collected during periods when preamble data may be processed.

The valid signal 251 provided by the symbol boundary detector 255 (not shown) may be used to indicate when the ADCs 310A and 310B are producing payload data. The valid signal 251 is coupled to the first and second ADC absolute value accumulators (315A and 315B respectively) and the first and second ADC sample averagers (330A and 330B respectively).

The first and second ADCs (310A and 310B respectively) provide the first digital baseband signal 311A and the second digital baseband signal 311B to the first ADC absolute value accumulator 315A and the second ADC absolute value accumulator 315B respectively. The ADC absolute value accumulators (315A and 315B) accumulate the absolute value of the output samples of the ADCs for a number of samples. In one embodiment, the ADC absolute value accumulators (315A and 315B) may accumulate only ADC absolute values related to payload data by qualifying the output samples of the ADCs (310A and 310B) with the valid signal 251 (i.e., accumulating only those output samples that are present when the valid signal is asserted true).

The first and second ADC absolute value accumulators 315A and 315B accumulate a first and second sum of absolute values. In one embodiment, the sum of the absolute values may be expressed by the following equation:

$$ADCsum(i) = \sum_n |x_n| \qquad \text{(eq. 1)}$$

where x is an ADC output sample qualified with the valid signal 251, n is an ADC output sample number, and i is 1 for the sum provided by the first ADC absolute value accumulator 315A and 2 for the sum provided by the second ADC absolute value accumulator 315B. Generally, the greater the number of output samples, the more accurate the gain offset calculation. In one embodiment, the number of samples n is $2^{15}$. In another embodiment, the number of samples n may be determined by software controlled registers such as a first and a second absolute value count registers 316A and 316B respectively. Generally, the gains of the first and second ADCs 310A and 310B may more accurately be matched when an equivalent number of samples is collected from each ADC. However, in some embodiments, a differing number of samples may be collected from each ADC. The output of the first and second ADC absolute value accumulators 315A and 315B are coupled to the gain calculator 320.

The gain calculator 320 may determine a gain compensation value from the sums provided by the first and second ADC absolute value accumulators 315A and 315B respectively. In one embodiment, the gain compensation value may be expressed as a ratio that describes the gain mismatch between the ADCs 310A and 310B with respect to the reference ADC. Since in this exemplary configuration, the reference ADC is the second ADC 310B, the gain compensation value GCV may be expressed by the following equation:

$$GCV = \frac{ADCsum(2)}{ADCsum(1)} \qquad \text{(eq. 2)}$$

The output of the gain calculator 320 is coupled to the gain adjustment block 325. The gain adjustment block 325 may modify the output of the first ADC 310A. In one embodiment, the gain adjustment block multiplies the output samples of the first ADC 310A with the gain compensation value GCV. The output of the gain adjustment block is coupled to the offset adjustment block 340.

The first and second ADC sample averagers (330A and 330B respectively) compute an average of a number of payload data samples provided by the first and second ADCs (310A and 310B respectively). The ADC sample averagers 330A and 330B may average ADC output samples related to payload data by qualifying the ADCs output data (310A and 310B respectively) with the valid signal 251. In one embodiment, the ADC output data may be processed prior to being provided to the ADC sample averagers 330A and 330B. For example, if gain compensation processing is provided to ADC output data prior to the first and second ADC sample averagers 330A and 330B, then the ADC output data provided to the first and second ADC sample averagers 330A and 330B may be modified by the gain compensation processing. In this exemplary configuration, the data for the first ADC sample averager 330A is provided by the gain adjustment block 325. This data is ADC output data from the first SAR ADC 310A that may have been processed for gain compensation. In one embodiment, the valid signal 251 may indicate which samples are related to payload data samples that have been processed by the gain adjustment block 325. In one embodiment, the number of output samples included in the average is thirty-two. In another embodiment, the number of output samples included in the average may be determined by software controlled registers such as a first and a second average sample count registers 331A and 331B respectively.

In one embodiment, the average calculated by the ADC sample averagers 330A and 330B may be an arithmetic average that may be described by the following equation:

$$ADCave(i) = \frac{1}{n}\sum_n x_n \quad \text{(eq. 3)}$$

where x is an ADC output sample qualified with the valid signal 251, n is the ADC output sample number, and i is 1 for the average provided by the first ADC sample averager and 2 for the average provided by the second ADC sample averager. In alternative embodiments, the average calculated by the ADC sample averager may be in accordance with other types of averages, such as a median average, a mode average, or the like.

The average values computed the first and second ADC sample averager 330A and 330B are provided to the offset calculator 335. In one embodiment, the offset calculator 335 calculates an offset adjustment that may be described by the following equation:

$$\text{OffsetAdjustment} = ADCave(2) - ADCave(1) \quad \text{(eq. 4)}$$

Again, since in this example the second SAR ADC 310B is the reference ADC, the offset compensation value may be added to the output of the first SAR ADC 310A. The output of the offset calculator 335 is coupled to the offset adjustment unit 340. The offset adjustment unit 340 adds the offset adjustment to the gain adjusted output of the first SAR ADC 310A provided by the gain adjustment unit 325. The output of the offset adjustment unit 340 is coupled to the interleaver 370. The interleaver 370 interleaves the gain and offset corrected data from the first SAR ADC 310A with the data from the second SAR ADC 310B. The interleaver 370 may provide interleaved gain and offset corrected ADC data to processors, memory, or other devices (not shown).

The ADC 220 may advantageously use two or more SAR ADCs to digitize analog signals instead of larger, less power efficient traditional ADCs. The output characteristics of the SAR ADCs can be compensated by examining the output of the ADCs and calculating one or more compensation values, which may be used to compensate the outputs of the one or more ADC. The compensation values may be determined while the ADCs are processing data. Thus, the ADCs advantageously do not need to be removed from service for calibration.

Figure 3A:
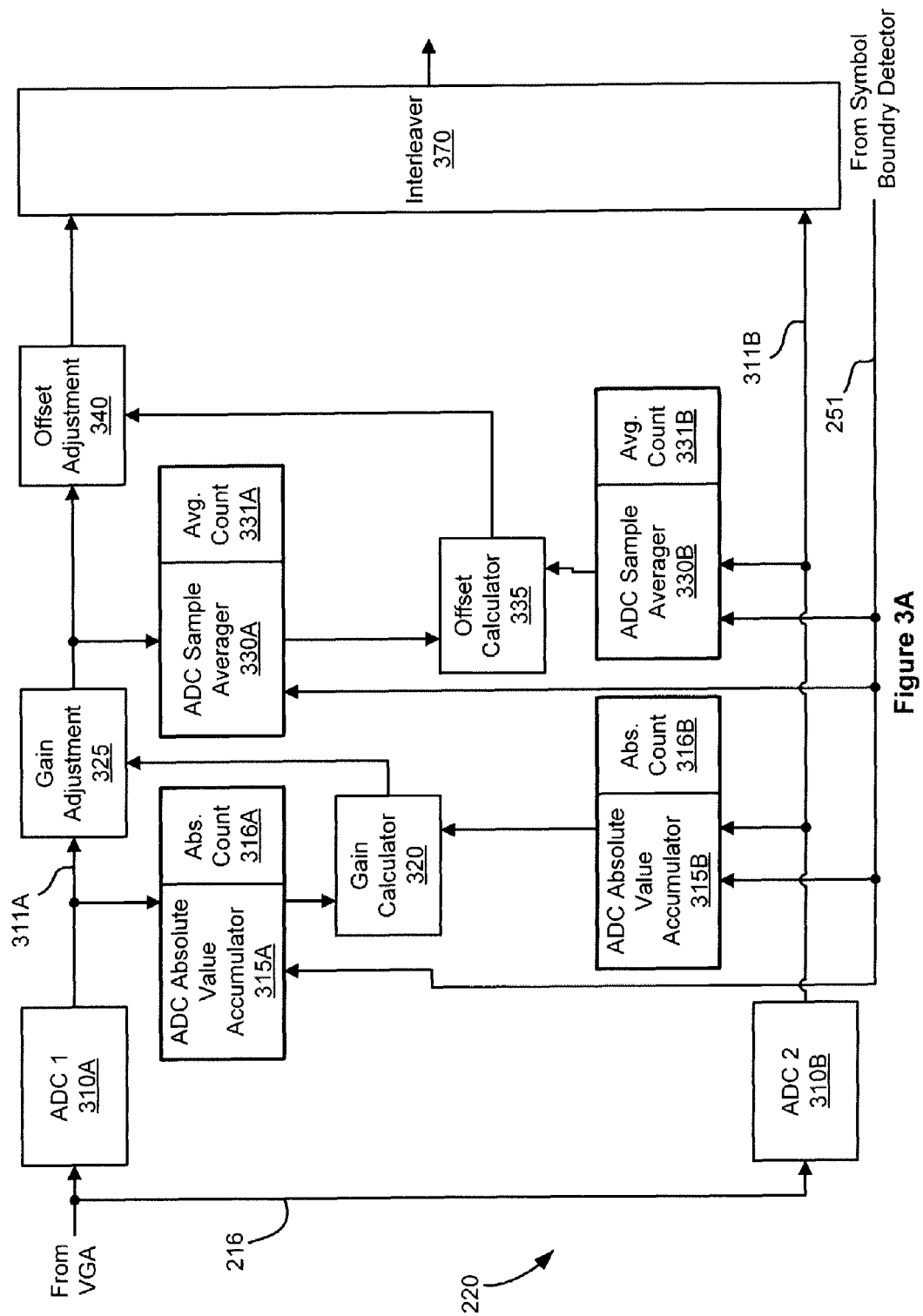
FIGS. 3A and 3B are detailed block diagrams of the ADC Block 220 shown in FIG. 2.
Figure 3B:
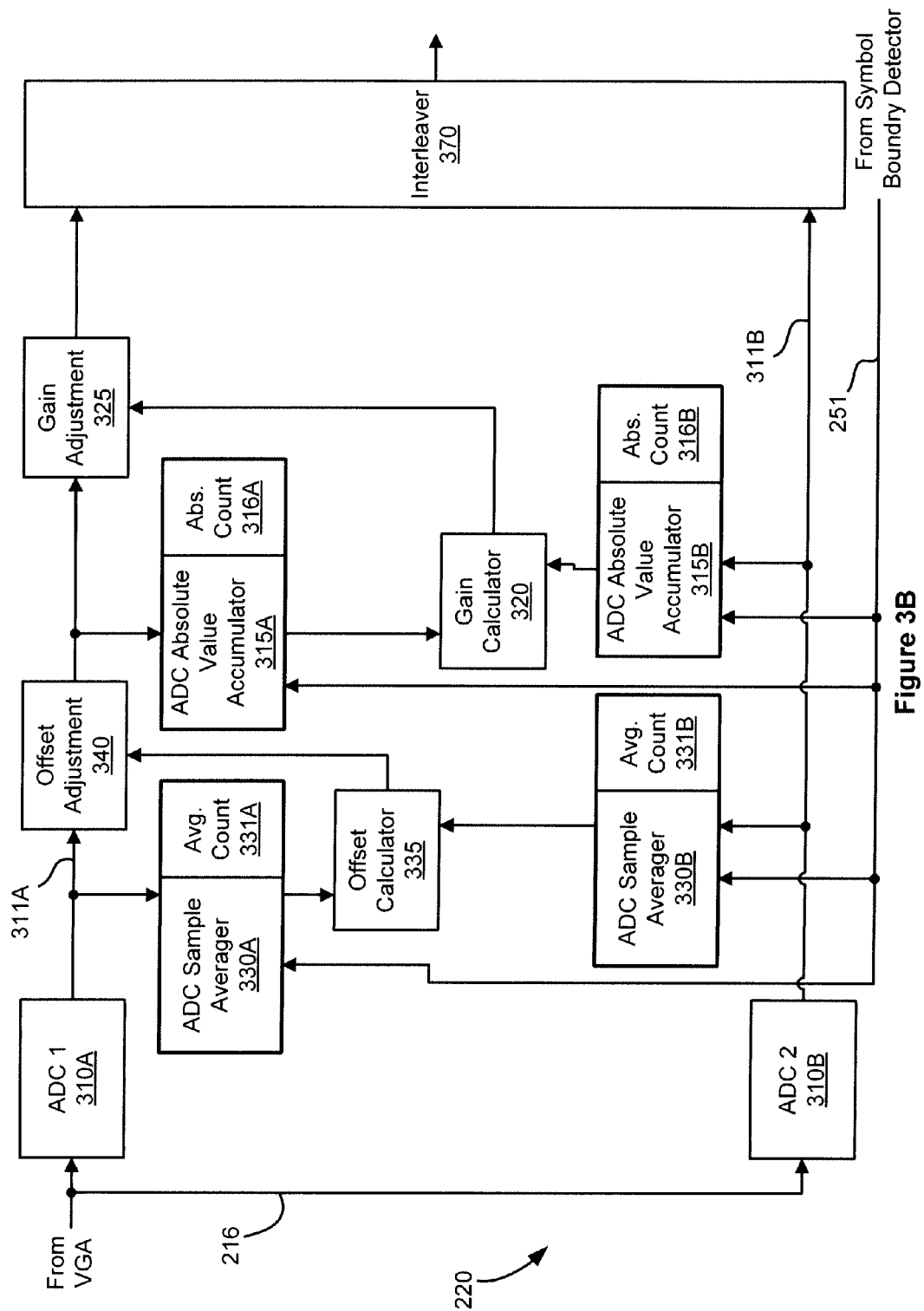

Those skilled in the art will recognize that the order of gain and offset compensation processing may be changed without substantially affecting the accuracy of the processing. For example, other embodiments of the ADC block 220 may provide offset compensation processing prior to gain compensation processing. FIG. 3B is a detailed block diagram of another embodiment of the ADC block 220. In contrast to the ADC block 220 illustrated by FIG. 3A, FIG. 3B illustrates an ADC block 220 in which offset compensation processing occurs before gain compensation processing.

Figure 4:
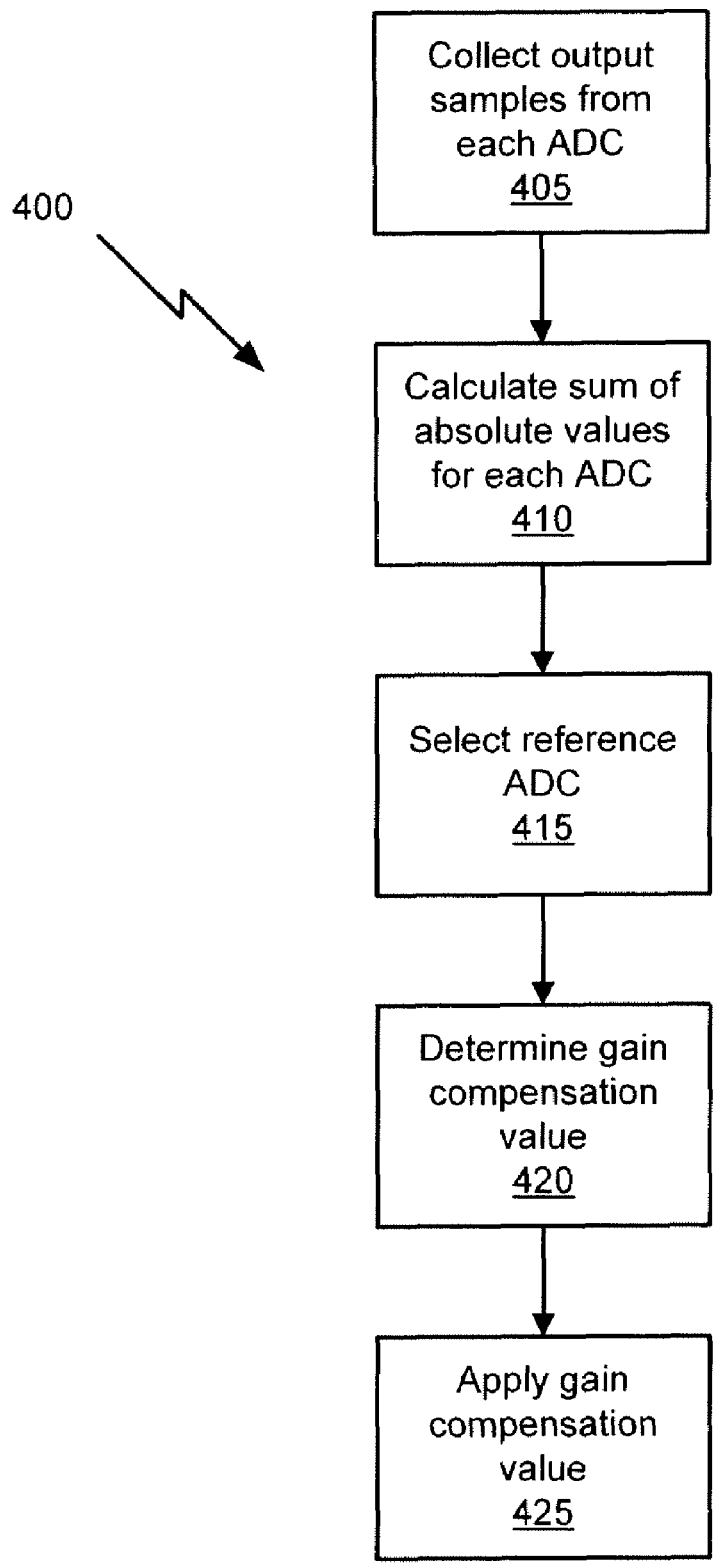
FIG. 4 is a flowchart of method steps for compensating the gain of two or more ADCs.

FIG. 4 is a flowchart 400 of method steps for compensating the gain of two or more ADCs. The method begins as step 405 collects ADC output samples from each ADC. As described herein, the output samples are preferably collected when the ADC is processing payload data, not when the ADC may be processing preamble data. In one embodiment, number of samples that are collected may be determined by a software controlled register. In another embodiment, the number of samples is $2^{15}$.

Step 410 calculates the sum of the absolute value of the collected samples for each ADC. In one embodiment, the sum for each ADC may be described by equation 1 where x is an ADC output sample and n is the number of samples. Next, step 415 specifies a reference ADC. An ADC may be specified to be a reference ADC as described in conjunction with FIG. 3.

Next, Step 420 determines a gain compensation value. In one embodiment, the gain compensation value may be the ratio of the absolute value sums calculated in step 410. As described herein, the ratio of the absolute value sums may be determined with respect to the reference ADC. In one embodiment, the ratio of absolute value sums may be described by equation 2.

Step 425 compensates the output of the non-selected (i.e., the non-reference) ADC. In one embodiment, the ADC output may be compensated by multiplying the ADC output by the gain compensation value determined in step 420.

Figure 5:
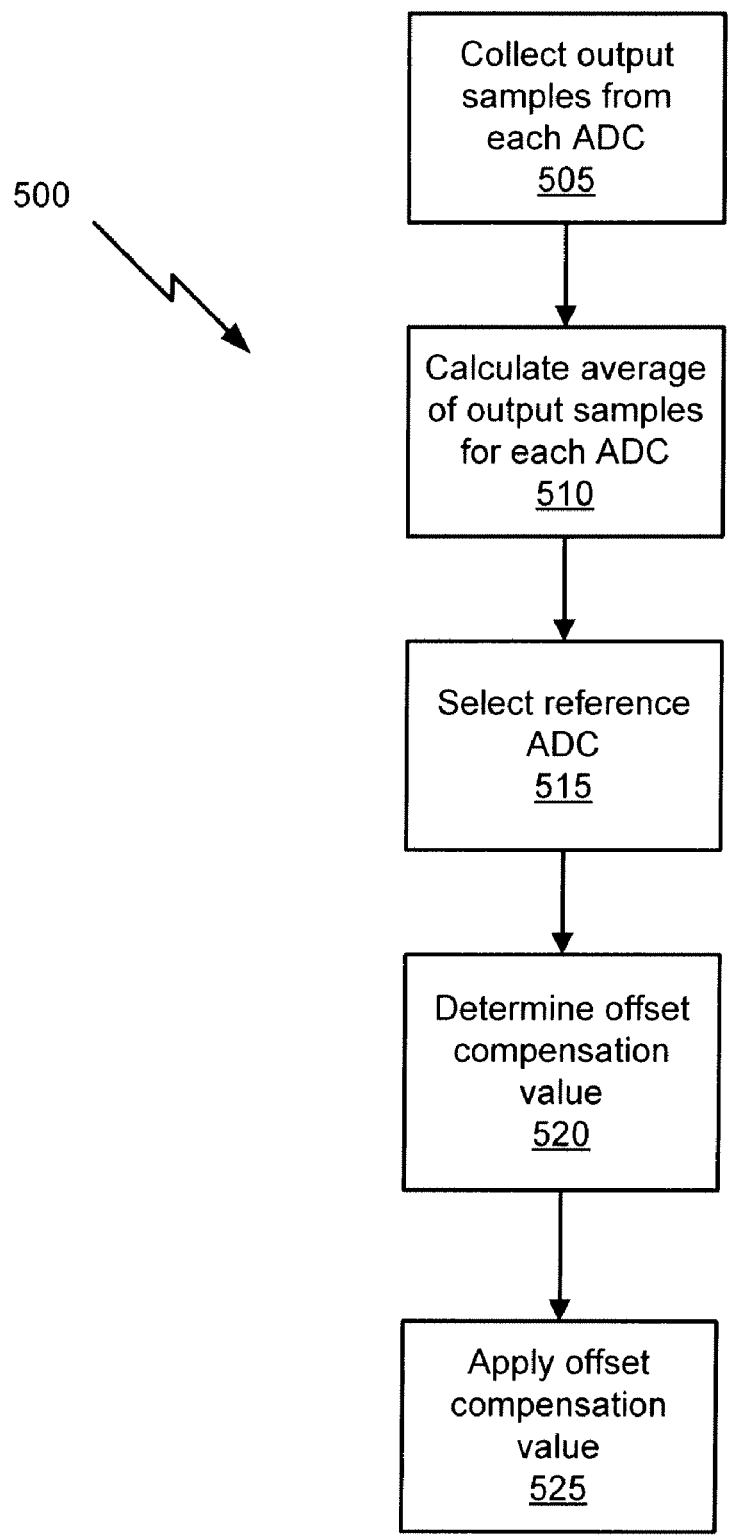
FIG. 5 a flowchart of method steps for compensating the offset of two or more ADCs.

FIG. 5 is a flowchart 500 of method steps for compensating the offset of two or more ADCs. The method begins as step 505 collects ADC samples from each ADC. Again, the output samples are preferably collected when the ADC is processing payload data, not when the ADC may be processing preamble data. In one embodiment, the number of samples that are collected may be determined by software. In another embodiment, thirty-two samples may be collected.

The method continues as step 510 calculates the average of the samples collected for each ADC. In one embodiment, the average may be an arithmetic average as described by equation 3 where x is an ADC output sample and n is the number of samples. Step 515 specifies a reference ADC. An ADC may be specified to be a reference ADC as described in conjunction with FIG. 3.

Next, step 520 determines an offset compensation value. In one embodiment, the offset compensation value may be the difference between the calculated averages. As described herein, the difference between the calculated averages may be determined with respect to a reference ADC. In one embodiment, the difference between calculated averages may be described by equation 4. In step 525, the offset compensation value is added to the output of the non-reference ADC.

The methods of FIGS. 4 and 5 advantageously allow the determination and application of gain and offset compensation values while the ADCs are processing data since the ADCs do not be removed from service to determine if calibration may be needed. When such ADCs are components within a wireless receiver, the overall throughput of the receiver may not be reduced during calibration events since the ADCs need not be removed from service.

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A method for compensating multiple ADCs in a wireless receiver, the method comprising:

collecting ADC output samples from multiple ADCs, wherein the ADC output samples are payload data samples;

specifying a reference ADC and a non-reference ADC from the multiple ADCs;

determining a gain compensation value from the ADC output samples collected from the reference ADC and the non-reference ADC; and applying the gain compensation value only to the ADC output samples from the non-reference ADC.

2. The method of claim 1, wherein the gain compensation value is determined by a ratio of m ADC output samples collected from the reference ADC to n ADC output samples collected from the non-reference ADC, wherein $m,n \geq 1$.

3. The method of claim 2, wherein the ratio of is determined by dividing a first sum of m absolute values of the ADC output samples collected from the reference ADC by a second sum of n absolute values of the ADC output samples collected from the non-reference ADC.

4. The method of claim 3, further comprising:
collecting gain-compensated ADC output samples;
determining an offset compensation value from the collected, gain-compensated ADC output samples and the ADC output samples from the reference ADC; and
applying the offset compensation value to the gain-compensated ADC output samples.

5. The method of claim 4, wherein the offset compensation value is determined by a difference between a first average of gain-compensated ADC output samples from a second average of ADC output samples collected from the reference ADC.

6. A method for compensating multiple ADCs in a wireless receiver, the method comprising:
collecting ADC output samples from multiple ADCs, wherein the ADC output samples are payload data samples;
specifying a reference ADC and a non-reference ADC from the multiple ADCs;
determining an offset compensation value from the ADC output samples collected from the reference ADC and the non-reference ADC; and
applying the offset compensation value to only the output samples from the non-reference ADC.

7. The method of claim 6, wherein the offset compensation value is determined by a difference of a first average of ADC output samples collected from the non-reference ADC from a second average of ADC output samples collected from the reference ADC.

8. The method of claim 7, further comprising:
collecting offset-compensated ADC output samples;
determining a gain compensation value from the offset-compensated ADC outputs samples and the output samples collected from the reference ADC; and
applying the gain compensation value to the offset-compensated ADC output samples.

9. The method of claim 8, wherein the gain compensation value is determined by a ratio of m ADC output samples collected from the reference ADC to n offset-compensated ADC output samples, wherein $m,n \geq 1$.

10. The method of claim 9, wherein the ratio is determined by dividing a first sum of m absolute values of the ADC output samples collected from the reference ADC by a second sum of n absolute values of the offset-compensated ADC output samples.

11. An ADC block in a wireless receiver, comprising:
a reference ADC;
at least one non-reference ADC;
a gain calculator configured to determine a gain compensation value for each non-reference ADC based on ADC output samples from the reference ADC and ADC output samples from the non-reference ADC, wherein the ADC output samples are payload data samples; and
a gain adjuster configured to adjust a gain of only each non-reference ADC by applying the gain compensation value determined for that non-reference ADC to the ADC output samples from that non-reference ADC.

12. The ADC block of claim 11, wherein the gain compensation value is determined by a ratio of a first sum of m absolute values of the reference ADC output samples to a second sum of n absolute values of the non-reference ADC output samples, wherein $m,n \geq 1$.

13. The ADC block of claim 12, further comprising:
an offset calculator configured to determine an offset compensation value for each non-reference ADC based on the reference ADC output samples and gain-compensated, non-reference ADC output samples; and
an offset adjuster configured to adjust an offset of each non-reference ADC by applying the offset compensation value determined for that non-reference ADC to the gain-compensated, non-reference ADC output samples.

14. The ADC block of claim 13, wherein the offset compensation value is determined by a difference between a first average of the gain-compensated ADC output samples from and a second average of ADC output samples from the reference ADC.

15. An ADC block in a wireless receiver, comprising:
a reference ADC;
at least one non-reference ADC;
an offset calculator configured to determine an offset compensation value for each non-reference ADC based on ADC output samples from the reference ADC and ADC output samples from the non-reference ADC, wherein the ADC output samples are payload data samples; and
an offset adjuster configured to adjust an offset of only each non-reference ADC by applying the offset compensation value determined for that non-reference ADC to the ADC output samples from that non-reference ADC.

16. The ADC block of claim 15, wherein the offset compensation value is determined by a difference between a first average of the non-reference ADC output samples from and a second average of the reference ADC output samples.

17. The ADC block of claim 16, further comprising:
a gain calculator configured to determine a gain compensation value for each non-reference ADC based on ADC output samples from the reference ADC and offset-compensated ADC output samples; and
a gain adjuster configured to adjust a gain of each non-reference ADC by applying the gain compensation value determined for that non-reference ADC to the offset-compensated output samples.

18. The ADC block of claim 17, wherein the gain compensation value is determined by a ratio of a first sum of m absolute values of the reference ADC output samples to a second sum of n absolute values of the gain-compensated ADC output samples, wherein $m,n \geq 1$.

* * * * *